United States Patent [19]
Burum et al.

[11] Patent Number: 5,245,284
[45] Date of Patent: Sep. 14, 1993

[54] METHOD FOR EDITING CPMAS SOLID-STATE NMR SPECTRA

[75] Inventors: Douglas P. Burum, Acton; Anthony J. Bielecki, Somerville, both of Mass.

[73] Assignee: Bruker Instruments, Inc., Billerica, Mass.

[21] Appl. No.: 954,694

[22] Filed: Sep. 30, 1992

Related U.S. Application Data

[63] Continuation of Ser. No. 681,571, Apr. 5, 1991, abandoned.

[51] Int. Cl.$^5$ .................................... G01R 33/20
[52] U.S. Cl. ................................. 324/321; 324/300
[58] Field of Search ............... 324/300, 307, 308, 309, 324/310, 311, 312, 313, 314, 318, 321; 128/653.5

[56] References Cited

U.S. PATENT DOCUMENTS

| | | | |
|---|---|---|---|
| 3,530,374 | 9/1970 | Haeberlen et al. | 324/307 |
| 3,781,650 | 12/1973 | Keller | 324/307 |
| 4,352,066 | 9/1982 | Kendrick et al. | 324/321 |
| 4,443,761 | 4/1984 | Levitt | 324/311 |
| 4,470,014 | 9/1984 | Levitt et al. | 324/311 |
| 4,486,709 | 12/1984 | Bendall | 324/300 |
| 4,510,449 | 4/1985 | Ernst et al. | 324/309 |
| 4,521,732 | 6/1985 | Pegg et al. | 324/300 |
| 4,682,107 | 7/1987 | Bendall et al. | 324/307 |
| 5,099,206 | 3/1992 | Imaizumi et al. | 324/307 |
| 5,117,186 | 5/1992 | Burum et al. | 324/307 |

FOREIGN PATENT DOCUMENTS

0467704A1 7/1991 European Pat. Off. ............... 33/30

OTHER PUBLICATIONS

P. Caravatti et al., "Heteronuclear Correlation Spectoscopy in Rotating Solids"; Chemical Physics Letter; vol. 100; No. 4, Sep. 1983; pp. 305-310.

P. Caravatti et al., "Heteronuclear Solid-State Correlation Spectroscopy"; Chemical Physics Letters; vol. 89; No. 5; Jul. 1982; pp. 363-367.

S. J. Opella, M. H. Frey, "Selection of Non-Protonated Carbon Resonances in Solid-State Nuclear Magnetic Resonance"; J. American Chem. Soc.; vol. 101; No. 19; Sep. 1979; pp. 5854-5856.

N. Chr. Nielsen et al.; "Spectral Editing of 13C NMR Spectra via Two-Dimensional Pulse Techniques"; J. of Magnetic Resonance; vol. 81; No. 3, Feb. 1989; pp. 500-511.

R. Tycko et al.; "Carbon-13 Zero–Field NMR in High Field"; J. of Magnetic Resonance; vol. 89; No. 1, Aug. 1990; pp. 205-209.

Frequency-Switched Pulse Sequences: Homonuclear Decoupling and Dilute Spin NMR in Solids, Bielecki et al.

Two-Dimensional Heteronuclear Chemical Shift Correlation Spectroscopy in Rotating Solids, Roberts et al.

Low-Power Multipulse Line Narrowing in Solid-State NMR, Burum et al.

Two-Dimensional Fourier Spectroscopy, pp. 285-286, Basic Principles.

NMR Images of Rotating Solids, Cory et al.

Proton-Polarization Transfer Enhancement of a Heteronuclear Spin Multiplet with Preservation of Phase Coherency and Relative Component Intensities, Pegg et al.

Magic-Angle-Sample-Spinning NMR Difference Spectroscopy, Groot et al.

Quantitative Determination of the Concentration of $^{13}C-^{15}N$ Chemical Bonds by Double Cross-Polarization NMR, Schaefer.

Two-Dimensional Rotational Spin-Echo Nuclear Magnetic Resonance in Solids: Correlation of Chemical Shift and Dipolar Interactions, Munowitz et al.

Primary Examiner—Michael J. Tokar
Attorney, Agent, or Firm—Cesari & McKenna

[57] ABSTRACT

A normal CPMAS experiment is modified to provide for spectral editing. In one embodiment of the invention, the conventional CPMAS experiment is performed with the proton decoupling RF applying at a frequency slightly different than the proton resonance frequency in order to suppress methylene ($CH_2$) resonances more severely than CH and $CH_3$ resonances.

In another embodiment of the invention the RF pulse sequence normally using during the cross-polarization period is replaced with a WIM RF pulse sequence which has the effect of suppressing the CH and $CH_3$ resonances, thereby leaving the $CH_2$ resonances.

7 Claims, 8 Drawing Sheets

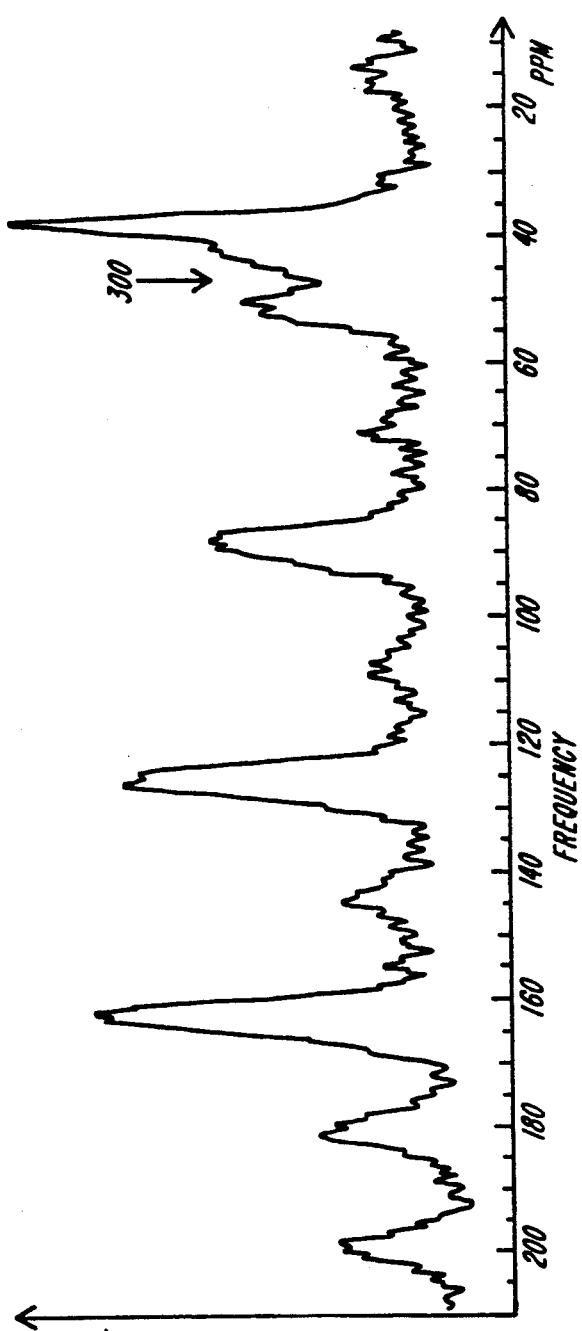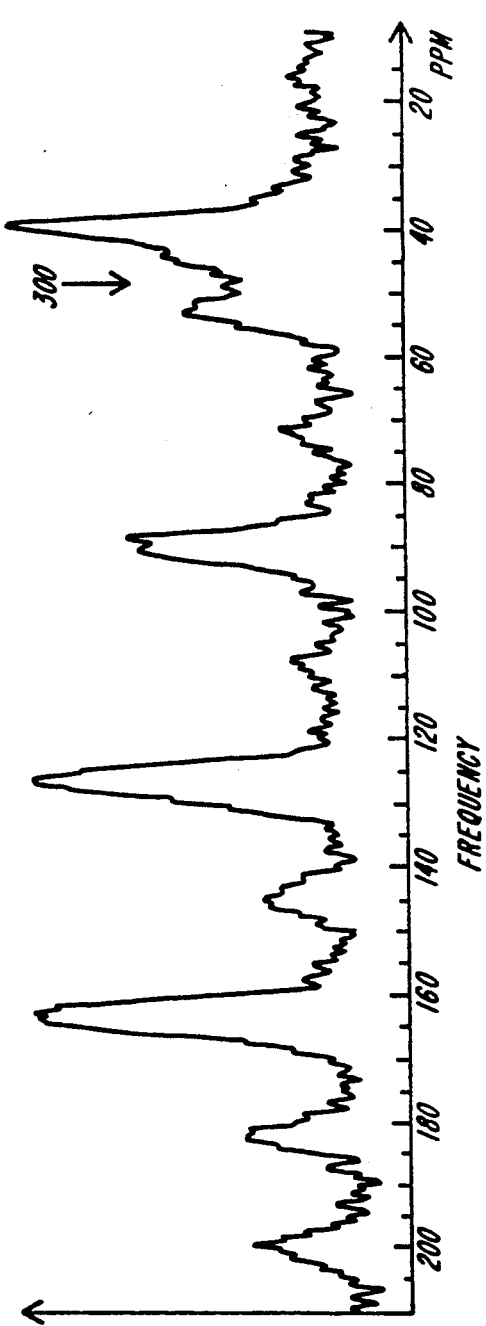

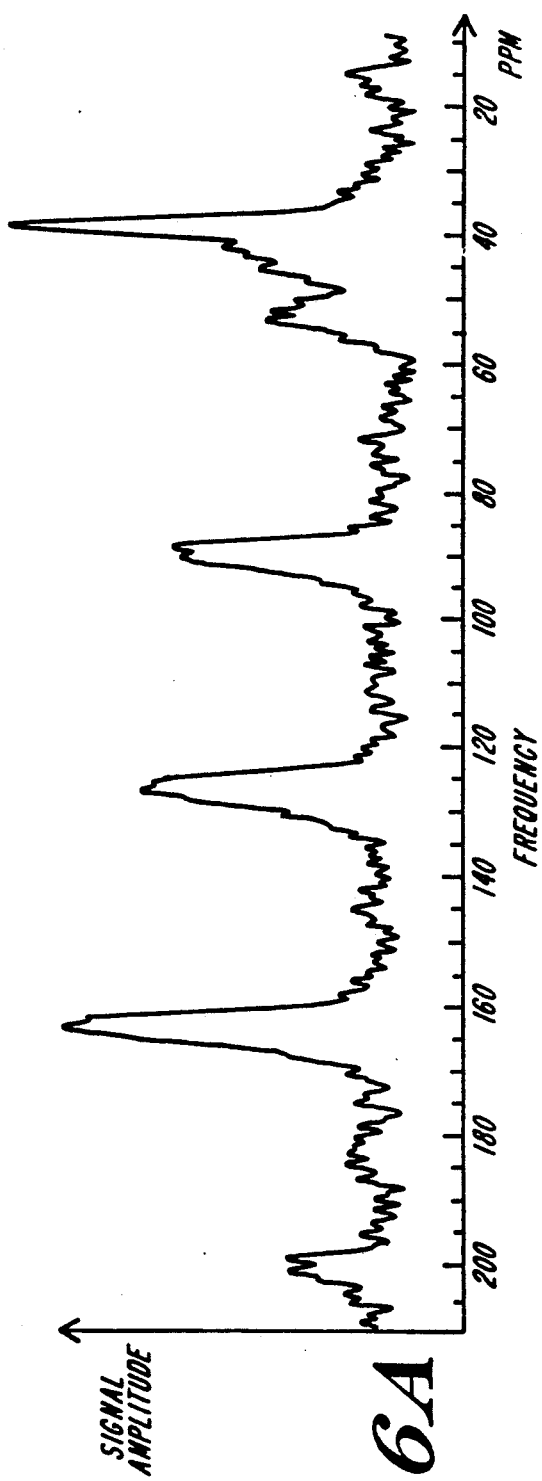
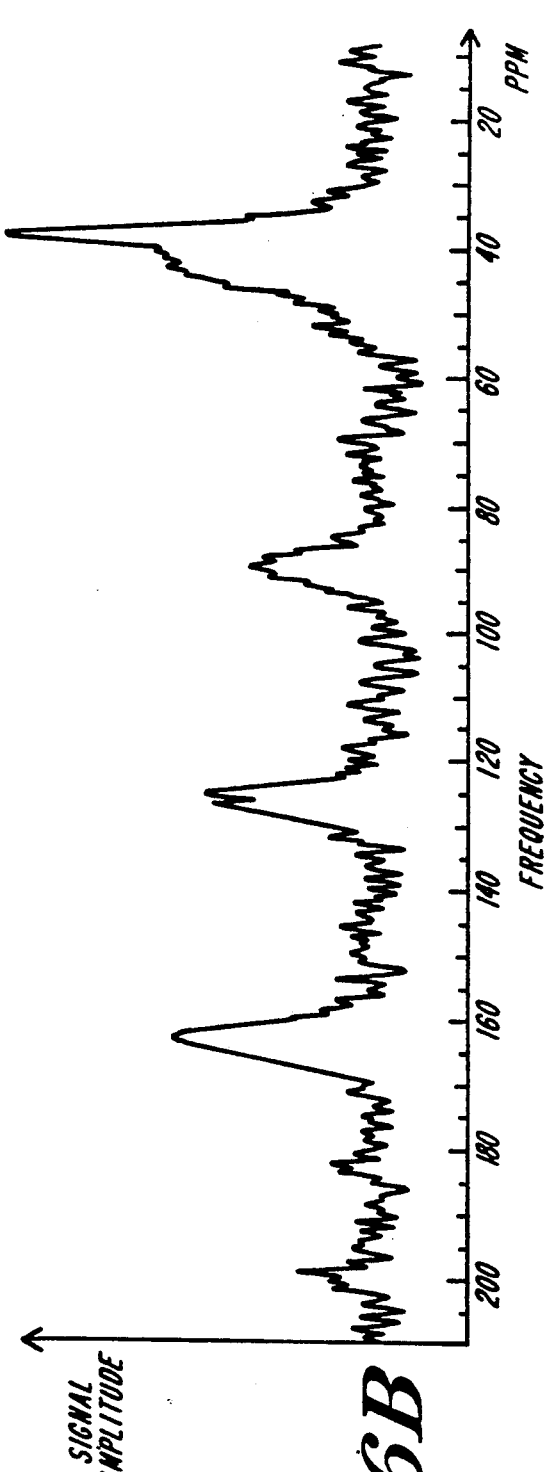
FIG.6A
FIG.6B

METHOD FOR EDITING CPMAS SOLID-STATE NMR SPECTRA

This application is a continuation of application Ser. No. 07/681,571, filed Apr. 5, 1991, abandoned.

FIELD OF THE INVENTION

This invention relates to solid state NMR spectroscopy and, in particular, to radio frequency pulse sequences for selectively suppressing resonance lines in CPMAS spectra.

BACKGROUND OF THE INVENTION

Nuclear magnetic resonance (NMR) is a phenomenon exhibited by a select group of atomic nuclei and is based upon the existence of nuclear magnetic moments in these nuclei (termed "gyromagnetic" nuclei). When a gyromagnetic nucleus is placed in a strong, uniform and steady magnetic field (a so-called "Zeeman field") and perturbed by means of a weak radio-frequency (RF) magnetic field, it precesses at a natural resonance frequency known as a Larmor frequency, which is characteristic of each nuclear type and is dependent on the applied field strength in the location of the nucleus. Typical gyromagnetic nuclei include $^1$H (protons), $^{13}$C, $^{19}$F and $^{31}$P. The resonant frequencies of the nuclei can be observed by monitoring the transverse magnetization which results after a strong RF pulse. It is common practice to convert the measured signal to a frequency spectrum by means of Fourier transformation.

Although identical nuclei have the same frequency dependence upon the magnetic field, differences in the chemical environment of each nucleus can modify the applied magnetic field in the local vicinity of the nucleus, so that nuclei in the same sample do not experience the same net magnetic field. The differences in the local magnetic field result in spectral shifts in the Larmor frequencies between two such chemically nonequivalent nuclei, called "chemical shifts". These chemical shifts are interesting in that they reveal information regarding the number and placement of the atoms in a molecule and in the positioning of adjacent molecules with respect to each other in a compound.

Unfortunately, it is not always possible to interpret the frequency spectra produced by the chemical shifts because of other interfering and dominant interactions This is particularly true in NMR spectroscopy of solids. In liquid NMR spectroscopy, the rapid motion of the liquid molecules tends to isolate the nuclei and separate the nuclear interactions, so that it is easier to distinguish separate nuclei in the final output. In solid state NMR, there are many interactions between the molecules which obscure the output. For example, the magnetic moments in neighboring nuclei perturb each other, resulting in interactions called dipole-dipole couplings. These couplings tend to broaden the characteristic resonance peaks and obscure the "fine" resonant structure produced by the chemical shifts. An additional problem found in solids, which is not present in liquids, is that the orientation of the solid molecules is relatively fixed with respect to the applied Zeeman field and, accordingly, the chemical shifts are anisotropic, in that a component of the resonant frequency depends on the physical orientation of the molecules with respect to the applied field.

Therefore, it is essential to suppress some interactions over others to obtain a meaningful output. This is usually done by perturbing the system at selected frequencies to cause unwanted interactions to cancel or average to a reduced amplitude. For example, in solids, the aforementioned chemical shift anisotropy is usually greatly reduced by orienting the solid sample at a "magic angle" (54°44') with respect to the applied Zeeman field and physically rotating the solid at a relatively rapid rate causing the anisotropic field components to average to zero.

Similarly, by well known techniques, it is possible to reduce the unwanted spin-spin interactions by irradiating the nuclei with additional pulses of RF energy at or near the Larmor frequencies. By properly selecting various orientations and phases of the RF pulses, the polarization of the perturbing nuclear spin systems in neighboring groups can be changed, effectively averaging out the spin interactions so that the contribution to the final output is greatly diminished. Since the Larmor frequencies for each nuclear type are distinct, an applied RF frequency will have a much greater effect on those nuclei which have a Larmor frequency which is close to the applied frequency than those nuclei in which the Larmor frequency is considerably different. Thus, the applied RF fields can be used to affect one type of nucleus while leaving others unchanged.

A conventional NMR technique which is used obtain NMR spectra of organic solids involves obtaining an output from $^{13}$C nuclei in the solid of interest. However, the $^{13}$C nuclei are not directly excited. Instead, $^1$H nuclei (protons) in the test sample are excited and various RF pulse sequences are used to transfer polarization from the protons to the $^{13}$C nuclei which are then observed. This technique is carried out in the presence of magic angle spinning and is referred to as Cross Polarized Magic Angle Spinning or CPMAS. The technique is described in more detail in "Solid State NMR for Chemists", Colin A. Fyfe, CFC Press, P.O. Box 1720, Guelph, Ontario, Canada N1H 6Z9, Chapter 6 and "High Resolution Solid State NMR of Carbon-13", R. G. Griffin, *Analytical Chemistry*, v. 49, p. 951A (1977) and generally involves performing a process or "experiment" in the time domain, consisting of three time intervals. During the first time period, the sample protons are placed in a excited, coherent non equilibrium state by the application of a single RF pulse to the sample, or by a sequence of RF pulses.

Next, the sample is subject to cross polarization during which RF pulses or continuous RF energy is applied to both the protons and the $^{13}$C nuclei, which causes the transfer of coherence or polarization from the protons to the $^{13}$C nuclei under observation.

The cross polarization period is followed by data acquisition in which the cross-polarizing energy is removed and a free induction decay (FID) occurs in the $^{13}$C nuclei and the resonance frequencies of the $^{13}$C nuclei are measured. During this period it is conventional to apply further pulses or continuous wave RF energy to the protons in order to decouple or prevent further interaction of the protons and $^{13}$C nuclei.

For many solid materials, the CPMAS technique produces well-differentiated spectra of the carbon nuclei in the test sample with good chemical shift resolution. The CPMAS spectra appear very similar to $^{13}$C NMR spectra of samples in solution, and they are used in much the same way.

However, in some cases, it is convenient to suppress some information in favor of other information. For example, the carbon atoms in a particular sample may be arranged so that resonance peaks or lines overlap and obscure each other. Alternatively, it may be desirable to differentiate the carbon resonance lines or spins, for example, by the number of directly bonded protons. In this manner, additional information can be gathered about the molecular structure.

The carbon spins typically can be differentiated by means of various spectral "editing" techniques. In $^{13}$C NMR spectroscopy of liquid samples, various well known editing techniques are commonly used to differentiate carbon spins according to the number of directly bonded protons. An example of such a technique is the so called DEPT RF pulse sequence described in "Proton-polarization Transfer Enhancement of a Heteronuclear Spin Multiplet with Preservation of Phase Coherency and Relative Component Intensities", D. T. Pegg, D. M. Doddrell, M. R. Bendall, *Journal of Chemical Physics*, v. 77, n. 6, pp. 2745-2752 (1982). The DEPT technique can differentiate between resonances resulting from CH, CH$_2$ and CH$_3$ functional groups.

However, only a few prior art spectral editing methods have been used for solid state CPMAS experiments; one common such prior art editing technique is called dipolar dephasing and is described in "Selection of Non-Protonated Carbon Resonances in Solid State Nuclear Magnetic Resonance", S. J. Opella, D. M. H. Frey, *Journal of the American Chemical Society*, v. 101, p. 5855 (1979). In this editing method, the $^{13}$C proton decoupling energy is interrupted briefly just before the start of data acquisition. The result is that the carbon spins which have one or more attached protons are suppressed in the output, while non protonated carbons are largely unaffected. This technique is useful, but it does not differentiate between the carbons that have one or more attached protons (CH, CH$_2$ and CH$_3$ groups).

Other, so called "difference" prior art spectral editing techniques have been proposed as described in "Quantitative Determination of the Concentrations of $^{13}$C-$^{15}$N Chemical Bonds by Double Cross-Polarization NMR", J. Schaefer, E. O. Stejskal, J. R. Garbow and R. A. McKay, *Journal of Magnetic Resonance*, V. 59, pp. 150-156 (1984) and "Magic Angle Sample Spinning NMR Difference Spectroscopy", H. J. M. DeGroot, V. Copie, S. O. Smith, P. J. Allen, C. Winkle, J. Lugtenburg, J. Herzfeld and R. G. Griffin, *Journal of Magnetic Resonance*, v. 77, pp. 251-257 (1988), but they typically depend on either the presence of a third nuclear species or on isotopic enrichment and labeling, and are therefore useful only in special cases.

Accordingly, it is an object of the present invention to provide editing of conventional CPMAS solid state NMR spectra It is another object of the present invention to increase the number of carbon sites which can be resolved in conventional CPMAS solid state NMR spectra.

It is still another object of the present invention to provide editing of conventional CPMAS solid state NMR spectra by modifying the proton decoupling portion of a conventional CPMAS solid state NMR experiment It is yet another object of the present invention to provide a editing of conventional CPMAS solid state NMR spectra by modifying the proton decoupling energy during the acquisition of data.

It is a further object of the present invention to provide a new RF pulse sequences during the cross-polarization period to effectively suppress carbon resonances other than methylene carbons.

SUMMARY OF THE INVENTION

The foregoing problems are solved and the foregoing objects are achieved in illustrative embodiments of the invention, in which the normal CPMAS experiment is modified to provide for spectral editing. In one embodiment of the invention, the conventional CPMAS experiment is performed with the proton decoupling RF applying at a frequency slightly different than the proton resonance frequency in order to suppress methylene (CH$_2$) resonances more severely than CH and CH$_3$ resonances.

In another embodiment of the invention the RF pulse sequence normally using during the cross polarization period is replaced with another new sequence which has the effect of suppressing the CH and CH$_3$ resonances, thereby leaving the CH$_2$ resonances.

BRIEF DESCRIPTION OF THE DRAWING

FIG. 3B shows a polystyrene spectrum of signal amplitude versus frequency with the proton decoupling RF applied at an offset of 2500 Hz from the proton resonance frequency.

FIG. 3C shows a polystyrene spectrum of signal amplitude versus frequency with the proton decoupling RF applied at an offset of 5000 Hz from the proton resonance frequency.

FIG. 6A shows a polystyrene spectrum of signal amplitude versus frequency obtained in the CPMAS experiment illustrated in FIGS. 4A–4D in which the rotor period was set equal to three times the WIM sequence time and the spectra was obtained after four WIM sequences.

FIG. 6B shows a polystyrene spectrum of signal amplitude versus frequency obtained in the CPMAS experiment illustrated in FIGS. 4A–4D in which the rotor period was set equal to three times the WIM sequence time and the spectra was obtained after three WIM sequences.

DETAILED DESCRIPTION OF THE PREFERRED EMBODIMENTS

Figure 1A:
FIG. 1A schematically illustrates the proton channel of a conventional CPMAS experiment indicating the RF energy applied to the protons.
Figure 1B:
FIG. 1B schematically illustrates the carbon channel of a conventional CPMAS experiment indicating the RF energy applied to the $^{13}$C nuclei.

A conventional CPMAS experiment is schematically illustrated in FIGS. 1A and 1B which shown the proton and carbon channels, respectively. FIGS. 1A and 1B show only the RF portion of the experiment. During the entire experiment, the test sample is placed in a rotor with an axis canted at the magic angle to the applied main Zeeman field and rotated at high speed in a conventional fashion.

During the first time period, the sample protons are placed in a excited, coherent non equilibrium state by the application of a single RF $\pi$ pulse 100 to the sample in a known fashion. No RF energy is applied to the carbon nuclei at this time.

Next, the sample is subjected to cross polarization energy during which continuous-wave RF energy, 102, is applied to both the protons and the $^{13}C$ nuclei at the respective resonant frequencies. Typically, the continuous energy amplitudes are adjusted to meet a condition known as the "Hartmann Hahn" condition as is well-known.

The cross polarization period is followed by a data acquisition period 104 in which the cross polarizing energy is removed and an FID 106 occurs in the $^{13}C$ nuclei and the resonance frequencies of the $^{13}C$ nuclei are measured. During this period it is conventional to apply continuous wave RF decoupling energy 108 at the proton resonance frequency to the protons.

In accordance with a first embodiment of the invention, the conventional CPMAS experiment illustrated in FIGS. 1A and 1B is performed with modified proton decoupling RF energy at point 108. As previously mentioned, this energy effectively decouples the protons from the $^{13}C$ nuclei and suppresses heteronuclear couplings. In accordance with the invention, spectral editing can be performed by applying proton decoupling RF energy at a frequency purposely off the proton resonance frequency (typically about 3 or 4 KHz off resonance) depending on the decoupling strength. If the CPMAS experiment is run with the decoupling RF so modified, then the protons are not totally decoupled from the $^{13}C$ nuclei and, as will be explained below, methylene resonances ($CH_2$) are effectively suppressed.

After an initial excitation, the nuclear spins change or evolve in time in known ways which can be described mathematically by means of a mathematical operator known as the Hamiltonian operator. The overall Hamiltonian can be considered as the sum of the Hamiltonian operators each of which results from separate perturbations such as dipolar coupling, chemical shifts, susceptibility and field gradient. The effect of the off-resonance decoupling can be seen by examining the heteronuclear dipolar Hamiltonian.

More particularly, the decoupling RF field strength can be expressed in terms of a resonant "frequency" since the nuclear resonant frequency is proportional to the RF field strength. Using this notation, if the decoupling RF field strength is denoted by $\omega_{rf}$ Hz and the frequency offset of the decoupling field from the proton resonance frequency is $\omega_{off}$ Hz, then the result of running the CPMAS experiment with off resonance decoupling RF power is to re-introduce a small scaled heteronuclear dipolar coupling $H_{IS}(\text{eff})$ that is given by $$H_{IS}(\text{eff}) = H_{IS}\omega_{off}/(\omega_{off}^2 + \omega_{rf}^2)^{\frac{1}{2}} \qquad (1)$$

Since the RF field strength will typically be much greater than the resonance offset ($\omega_{rf} >> \omega_{off}$), then $(\omega_{off}^2 + \omega_{rf}^2) \approx \omega_{rf}^2$ and equation (1) can be approximated by:

$$H_{IS}(\text{eff}) = H_{IS}\omega_{off}/\omega_{rf} \qquad (2)$$

Therefore, the Hamiltonian which governs the heteronuclear dipolar coupling is re introduced, but scaled by the ratio of the offset to the RF frequency and the amount of coupling can be adjusted by increasing or decreasing the amount of decoupling power offset. The effect of $H_{IS}(\text{eff})$ is to broaden the spectral lines to a greater or lesser extent according to the proton carbon coupling strength and as $H_{IS}(\text{eff})$ increases, the broadening effect also increases. This broadening has the effect of suppressing methylene resonances more severely than CH and $CH_3$ resonances, since it is generally true that methylene groups have the strongest coupling. Methyl groups normally have much weaker coupling due to rotational motion, and CH couplings are also weaker than methylene couplings since only one proton is involved instead of two.

Figure 2A:
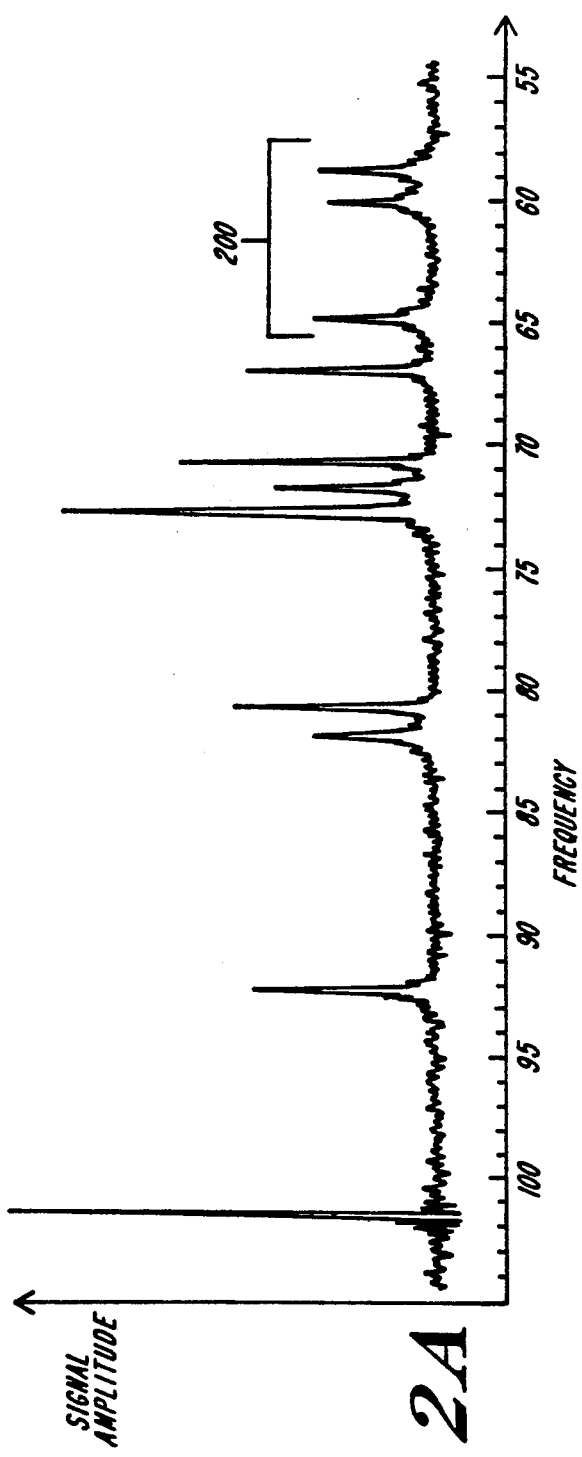
FIG. 2A shows a sucrose spectrum of signal amplitude versus frequency obtained with the conventional CPMAS experiment with the proton decoupling RF applied at the proton resonance frequency.
Figure 2B:
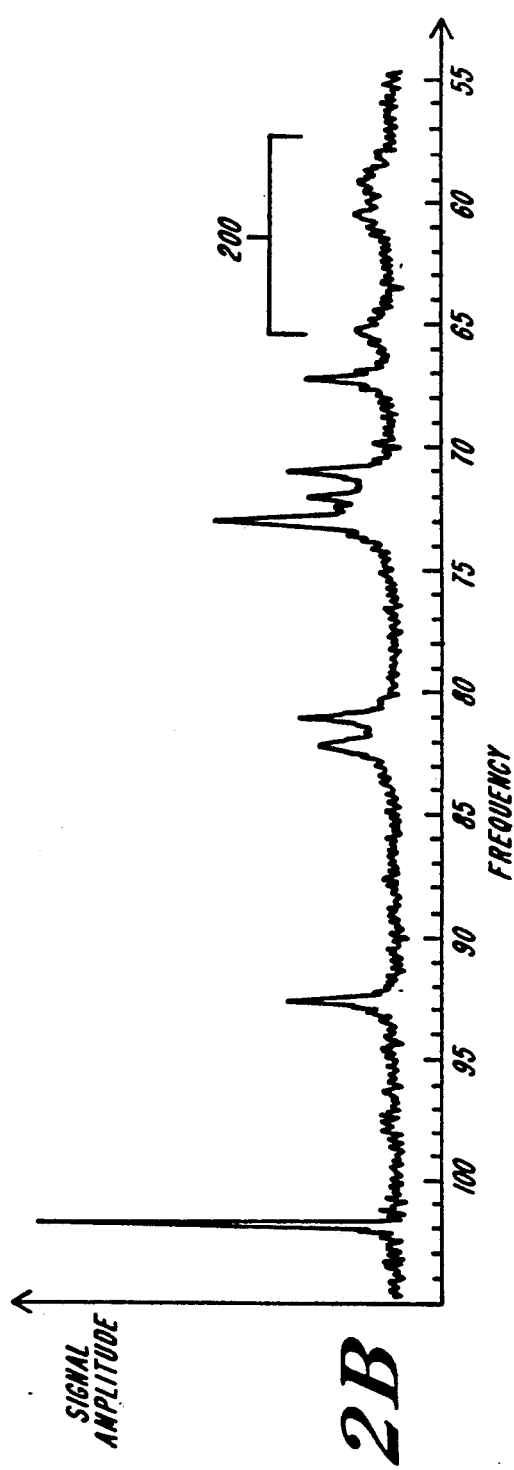
FIG. 2B shows a sucrose spectrum of signal amplitude versus frequency with the proton decoupling RF applied at an offset of 2500 Hz from the proton resonance frequency.
Figure 2C:
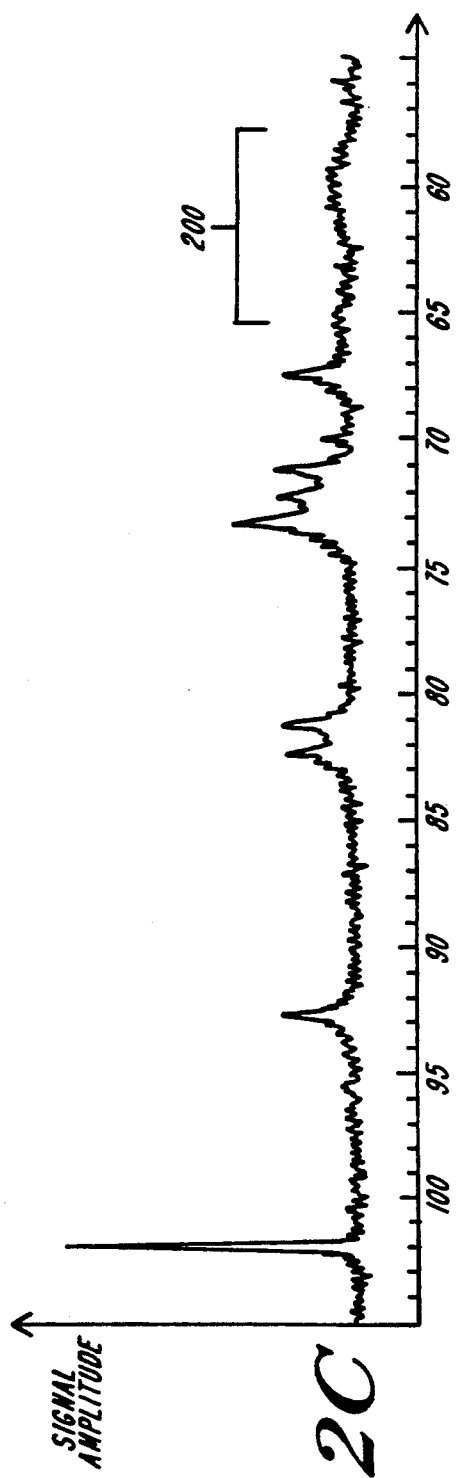
FIG. 2C shows a sucrose spectrum of signal amplitude versus frequency with the proton decoupling RF applied at an offset of 3500 Hz from the proton resonance frequency.

A comparison of a conventional sucrose spectrum with sucrose spectra produced by the inventive technique is shown in FIGS. 2A-2C. The spectra shown in FIGS. 2A-2C were obtained using an unmodified model MSL-400 NMR spectrometer manufactured by Bruker Instruments, Inc., 19 Fortune Drive, Manning Park, Billerica, Mass. 01821. The spectrometer was adjusted according to a conventional and well known CRAMPS (Combined Rotation and Magic Angle Spinning) tuning procedure. A 5 mm sphere of water was used to tune the proton channel, and a similar sphere of $^{13}C$ enriched benzene was used to tune the carbon channel. In addition, the rotation rate of the MAS rotor was controlled by active regulation in a conventional fashion. The plots are of signal amplitude versus frequency. The vertical axis is nominal, only relative signal amplitudes are of significance. Since the Larmor frequencies are dependent on the magnetic field strength, it is customary to express frequency in terms of a standard calibration frequency. Thus, the horizontal axis is marked in terms of parts per million of the calibration frequency.

FIG. 2A shows the sucrose spectrum obtained with the conventional CPMAS experiment with the proton decoupling RF applied at the proton resonance frequency. FIG. 2B shows a sucrose spectrum with the proton decoupling RF applied at an offset of 2500 Hz from the proton resonance frequency and FIG. 2C shows a sucrose spectrum with the proton decoupling RF applied at an increased offset of 3500 Hz from the proton resonance frequency.

As discussed above, the inventive technique suppresses methylene resonances. A comparison of the FIG. 2A spectrum with decoupling on resonance with FIGS. 2B and 2C with decoupling and off-resonance shows clearly that only the three down field peaks 200 are methylene carbons. Peaks are suppressed in FIG. 2B and further suppressed as the offset increases as shown in FIG. 2C.

Figure 3A:
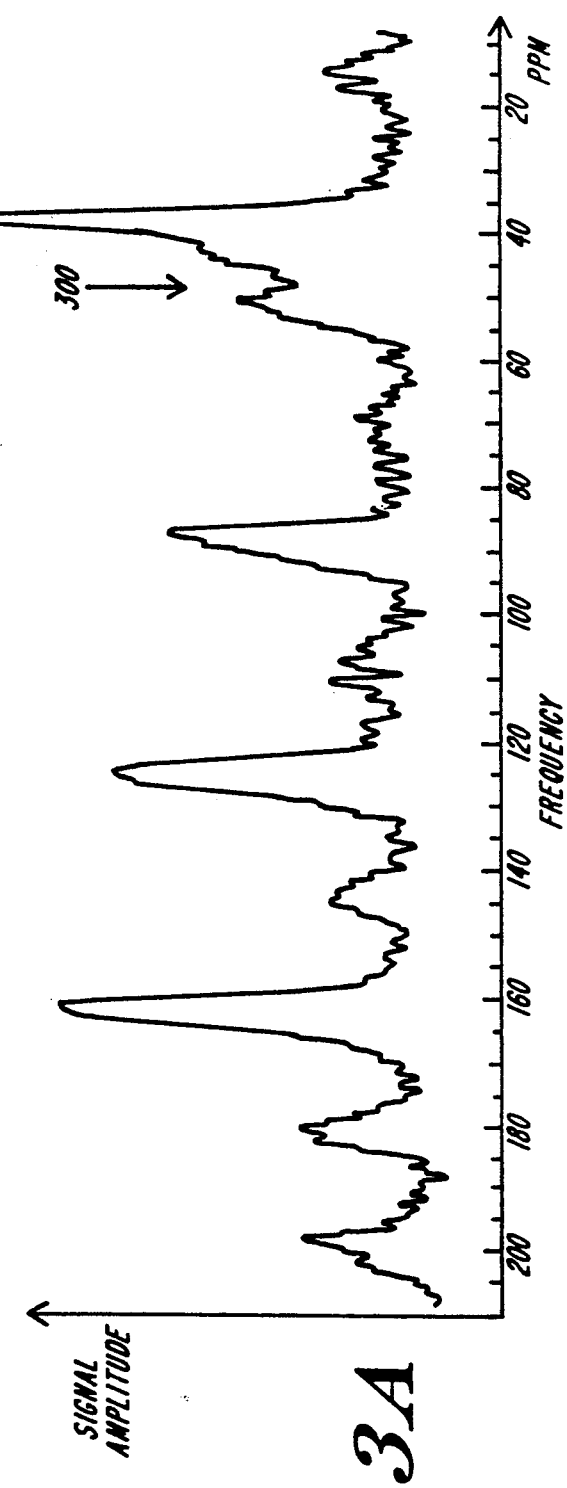
FIG. 3A shows a polystyrene spectrum of signal amplitude versus frequency obtained with the conventional CPMAS experiment with the proton decoupling RF applied at the proton resonance frequency.
Figure 3D:
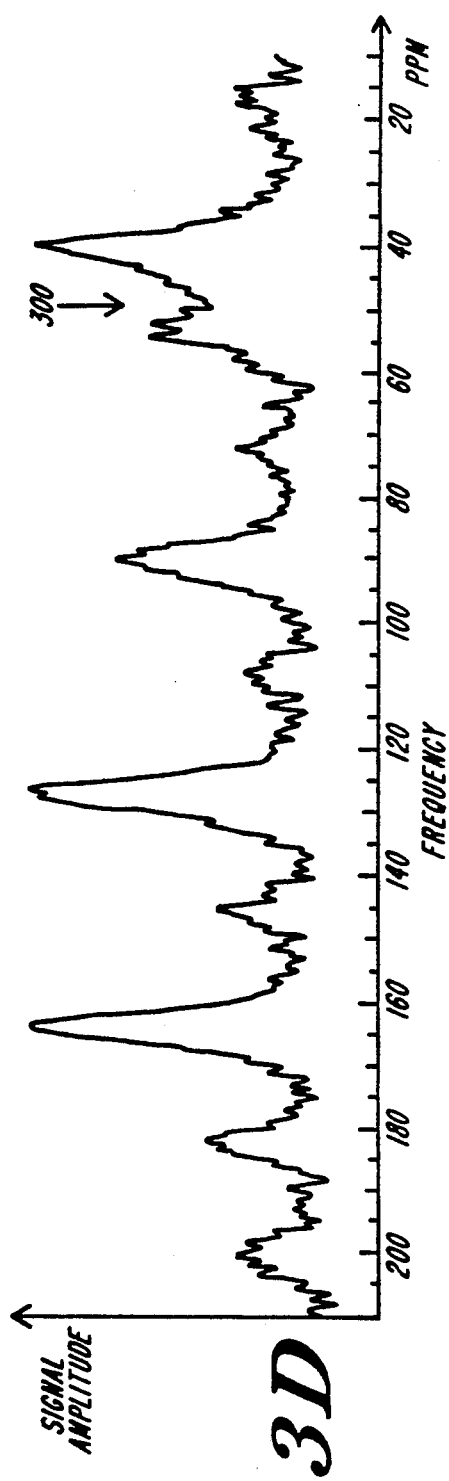
FIG. 3D shows a polystyrene spectrum of signal amplitude versus frequency with the proton decoupling RF applied at an offset of 7500 Hz from the proton resonance frequency FIG. 4A schematically illustrates the proton channel of a CPMAS experiment modified in accordance with one embodiment of the invention indicating the RF energy applied to the protons.

This above embodiment of the invention is primarily effective for test samples which yield spectra with relatively narrow resonance lines. When sample inhomogeneity or other resonance line broadening factors are present, it can be difficult or impossible to use this technique to differentiate between methylene and other carbon resonances. For example, FIGS. 3A-3D illustrate CPMAS spectra of polystyrene obtained under the same conditions as the sucrose spectra illustrated in FIGS. 2A-2C. More particularly, FIG. 3A shows the polystyrene spectrum obtained with the conventional CPMAS experiment with the proton decoupling RF applied at the proton resonance frequency. FIG. 3B shows a polystyrene spectrum with the proton decoupling RF applied at an offset of 2500 Hz from the proton resonance frequency. FIG. 3C shows a polystyrene spectrum with the proton decoupling RF applied at an offset of 5000 Hz from the proton resonance frequency and FIG. 3D shows a polystyrene spectrum with the proton decoupling RF applied at an offset of 7500 Hz from the proton resonance frequency.

Although the resonance line at 45 ppm (point 300) is actually a methylene carbon resonance, a comparison of FIGS. 3A-3D shows that almost no conclusions can be drawn with regard to spectral line assignments even with substantial resonance offsets.

Figure 4A:
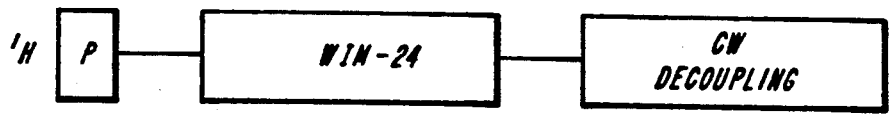
FIG. 4B schematically illustrates the carbon channel of a CPMAS experiment modified in accordance with one embodiment of the invention indicating the RF energy applied to the $^{13}$C nuclei.
FIG. 4C schematically illustrates the WIM sequence applied to the protons for cross polarization in the experiment illustrated by FIGS. 4A and 4B.
FIG. 4D schematically illustrates the WIM sequence applied to the $^{13}C$ nuclei for cross polarization in the experiment illustrated by FIGS. 4A and 4B.
Figure 4B:
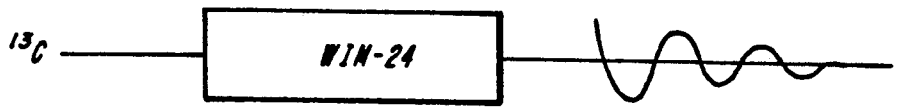

The aforementioned line broadening problem can be overcome with a second embodiment of the invention shown schematically in FIGS. 4A and 4B in which the conventional CPMAS experiment shown in FIGS. 1A and 1B is modified during the cross polarization portion 102 of the experiment. In accordance with the invention, the conventional Hartmann-Hahn cross-polarization continuous wave energy which is normally applied to both the protons and $^{13}C$ nuclei has been replaced by a windowless pulse sequence called the WIM sequence (Windowless Isotropic Mixing). This pulse sequence is commonly used in two dimensional heteronuclear correlation experiments during the mixing phase to obtain cross polarization as described in "Heteronuclear Correlation Spectroscopy In Rotating Solids", P. Caravatti, L. Braunschweiler and R. R. Ernst, *Chemical Physics Letters*, Vol. 100, No. 4, pp 305-310 (Sep. 1983).

Figure 4C:
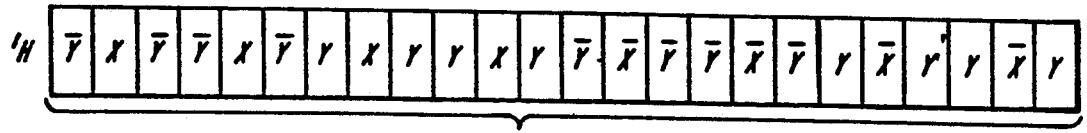
Figure 4D:
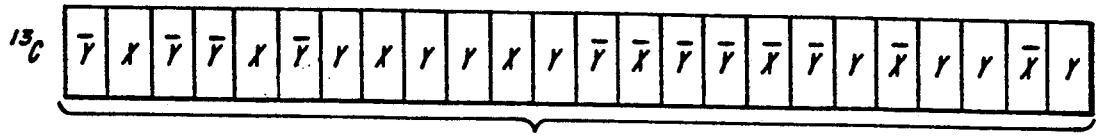

However, in accordance with the invention, when the WIM pulse sequence illustrated in FIGS. 4C and 4D is applied simultaneously to both the protons and carbons in the CPMAS experiment, the pulse sequence has the effect of isolating the protons from each other while allowing the protons and carbons to remain coupled.

More particularly, in FIGS. 4C and 4D, each box in the sequence which is designated with an X or Y marking comprises a single RF pulse applied to the system. By convention, the applied fields are referenced to a Cartesian coordinate system with the applied Zeeman field pointing along the Z-axis. Accordingly, the applied RF fields are polarized 90° to the Zeeman field or along the X and Y axes. Since the X and Y axes are arbitrary directional designations, the pulse designations of X and Y are taken to represent relative phases of the signals. For example a RF pulse designated as an X pulse has a relative phase shift of 90° with respect to an RF pulse designated as a Y pulse. Similarly, an RF pulse designated as X or −X has a relative phase shift of 180° with respect to an X pulse. In addition to applying the WIM sequence, the rotation rate of the sample is adjusted such that the rotor rotation period is an integral number of WIM cycle times 400.

In effect, the isolation of the protons causes the sample to appear in the NMR experiment as an ensemble of isolated CH, CH$_2$ and CH$_3$ spin groups. Of course, there remain direct couplings between carbon spins and more distant protons, but these can be largely ignored for the short time periods used in this second embodiment.

The spectral editing effect of the illustrative method may be understood by considering in detail the effect of magic angle spinning on the heteronuclear dipolar coupling of isolated CH and CH$_2$ groups. As before, this interaction is described by the heteronuclear dipolar Hamiltonia H$_{is}$. For the CH group, the heteronuclear dipolar Hamiltonia H$_{is}$ under the influence of the WIM cross-polarization sequence is given by:

$$H_{is} = \beta I_x S_x (1 - 3 \cos^2 \Theta) \tag{3}$$

where $\beta$ is constant describing the coupling strength between the proton and carbon nucleus, $I_z$ is a spin operator for the proton, $S_z$ is a spin operator for the carbon nucleus and $\Theta$ is the MAS rotor angle with respect to the applied Zeeman field.

Because the change over time of the complete Hamiltonian is complex, it is advantageous to use a simplification known as average Hamiltonian theory. Average Hamiltonian theory is a known simplification which is described in more detail in an article by U. Haeberlen and J. S. Waugh, *Physical Review*, v. 175, p. 453 (1968); "Advances in Magnetic Resonance", U. Haeberlen, v. 12, suppl. 1, edited by J. S. Waugh, Academic Press (1982) and "Transient Techniques in NMR of Solids", B. C. Gerstein and C. R. Dybowski, Academic Press (1985), which article and references are hereby incorporated by reference.

More particularly, if a Hamiltonian is assumed to be piecewise constant and periodic, average Hamiltonian theory takes on a particularly simple form in which a propagator is defined as $$U(\tau_c) = \exp(-iH_n t_n)\exp(-iH_{n-1}t_{n-1})\cdots \exp(-iH_1 t_1), \quad (4)$$

where $H_n$ is the active Hamiltonian during the nth time interval. When the products in equation (4) commute, that is, can be interchanged in order without affecting the overall result, Average Hamiltonian Theory allows the time dependent products in Equation (4) to be replaced with a simple propagator of the form $$U(\tau_c) = \exp(-i\bar{H}(\tau_c)\tau_c). \quad (5)$$

Where $\bar{H}(\tau_c)$ is the time-averaged Hamiltonian. Therefore, the time dependent term can be replaced by its time average without affecting the overall result.

Considering the heteronuclear dipolar Hamiltonian expressed in Eguation (3), as the sample rotates only the value of $\Theta$ changes. The Hamiltonian $H_{is}$ will therefore commute with itself at all times, and the effect of the time dependent Hamiltonian can be exactly described by its time averaged value, which is zero. In practice, this means that for a CH group, there will be no cross polarization from the protons to the carbons at times which are an integral multiple of the rotor period. The magnetization may flow back and forth during the rotation, but it will always totally "echo" back to the protons at the end of each rotation.

For each $CH_2$ group, the situation is somewhat different. The heteronuclear dipolar Hamiltonian $H_{is}$ in this case is given by $$H_{is} = \beta_1 I_{z1}S_z(1 - 3\cos^2\Theta_1) + \beta_2 I_{z2}S_z(1 - 3\cos^2\Theta_2) \quad (6)$$

where the subscripts 1 and 2 refer to the two protons.

Since, in general, the terms $\beta_1(1-3\cos^2\Theta_1)$ and $\beta_2(1-3\cos^2\Theta_2)$ will not be equal, the magnetization will not "echo" back to the protons at the end of each rotor rotation. However, the magnetization can be expected to rapidly reach a state of thermal equilibrium between the two spin systems, in much the same way it does when the conventional Hartmann Hahn cross polarization is used in a CPMAS experiment.

For methyl ($CH_3$) groups, the result is typically the same as for CH groups, since rapid thermal molecular rotation normally causes the effective values of $\beta_1$, $\beta_2$ and $\beta_3$ and of $\Theta_1$, $\Theta_2$ and $\Theta_3$ to be equal, with the result that the heteronuclear dipolar Hamiltonian commutes with itself at all times and can be replaced with its time average which is zero.

With the above properties of the applicable heteronuclear dipolar Hamiltonian, the editing effect of the WIM pulse sequence becomes immediately clear. If the system is allowed to cross-polarize under simultaneous proton and carbon WIM excitation for an integer number of rotor periods, theoretically, only the methylene resonances should appear in the output. In actual practice, complete suppression of the CH and $CH_3$ resonances does not occur for two reasons. First, the theoretical discussion does not take into account direct dipolar coupling between the CH and $CH_3$ carbons and more distant protons. Second, the WIM sequence itself is not perfect Although the sequence removes most of the proton-proton coupling, some coupling between protons will remain due to higher order terms in the WIM average Hamiltonian which are not completely time averaged to zero, and due to interference between the WIM pulse sequence and the sample rotation.

Under typical experimental conditions, there is time for only two or three complete WIM cycles during a single rotor rotation. FIGS. 5A-5D shows a CPMAS spectra of sucrose obtained with the same spectrometer and tuning conditions as the spectra in FIGS. 2A-2C and 3A-3D. However, unlike the experiment which resulted in the FIGS. 2A-2C and 3A-3D spectra, in FIGS. 5A-5D experiment, the WIM pulse sequence was used for cross polarization and decoupling energy was applied at the proton resonance frequency and the rotor period was adjusted to be exactly three times the WIM cycle time. Accordingly, the CH and $CH_3$ resonances should be suppressed at outputs taken at integral multiples of the rotor period.

Figure 5A:
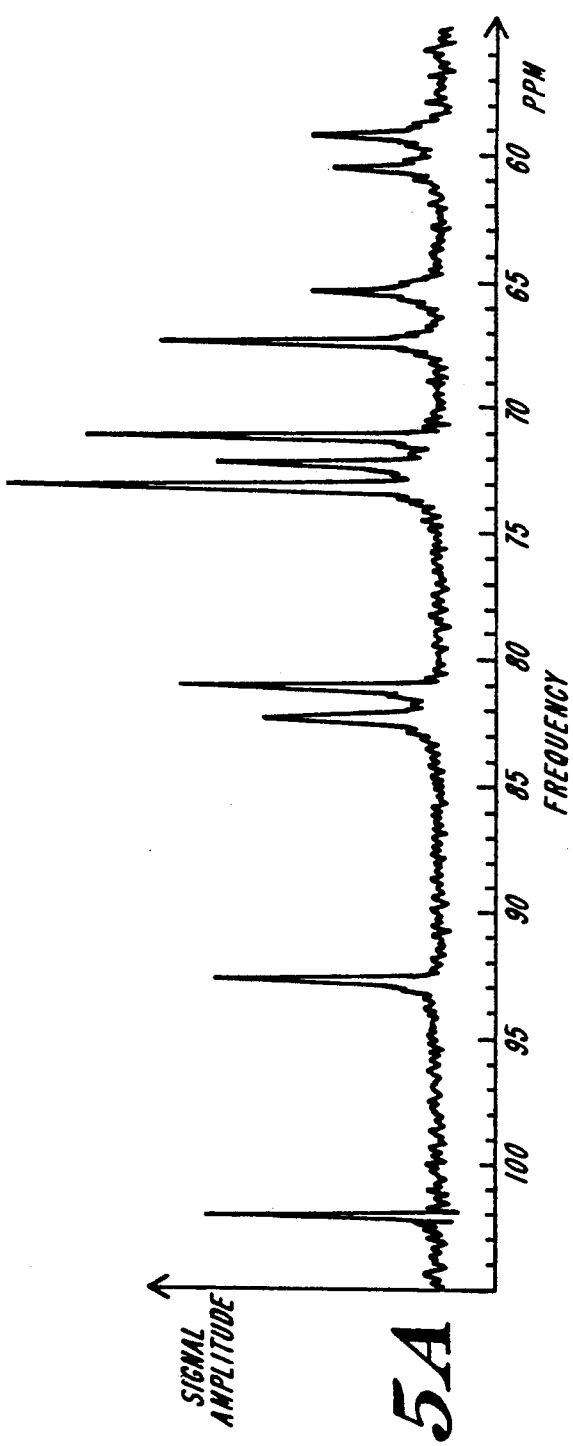
FIG. 5A shows a sucrose spectrum of signal amplitude versus frequency obtained in the CPMAS experiment illustrated in FIGS. 4A–4D in which the rotor period was set equal to three times the WIM sequence time and the spectra was obtained after four WIM sequences.
Figure 5B:
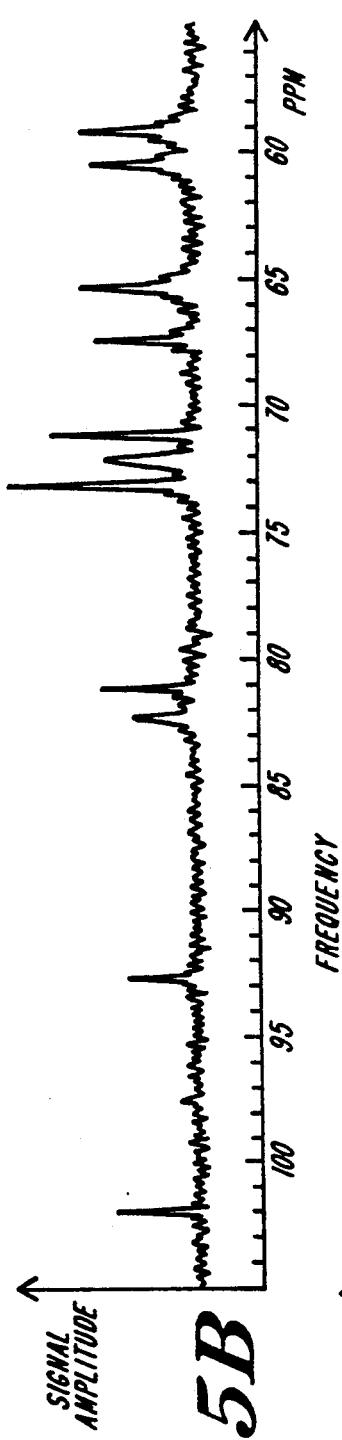
FIG. 5B shows a sucrose spectrum of signal amplitude versus frequency obtained in the CPMAS experiment illustrated in FIGS. 4A–4D in which the rotor period was set equal to three times the WIM sequence time and the spectra was obtained after three WIM sequences.

FIG. 5A shows an output spectra taken after four WIM cycles and thus it is not an a rotor period multiple. FIG. 5B shows a spectra taken after three WIM cycles or at a rotor period multiple. According to the theoretical analysis above, the CH and $CH_3$ resonances should be suppressed in the FIG. 5B spectrum. A comparison of the FIGS. 5A and 5B spectra clearly shows a selective suppression of the non methylene resonance lines when the system was allowed to cross polarize for exactly one rotor period as shown in FIG. 5B.

Figure 5C:
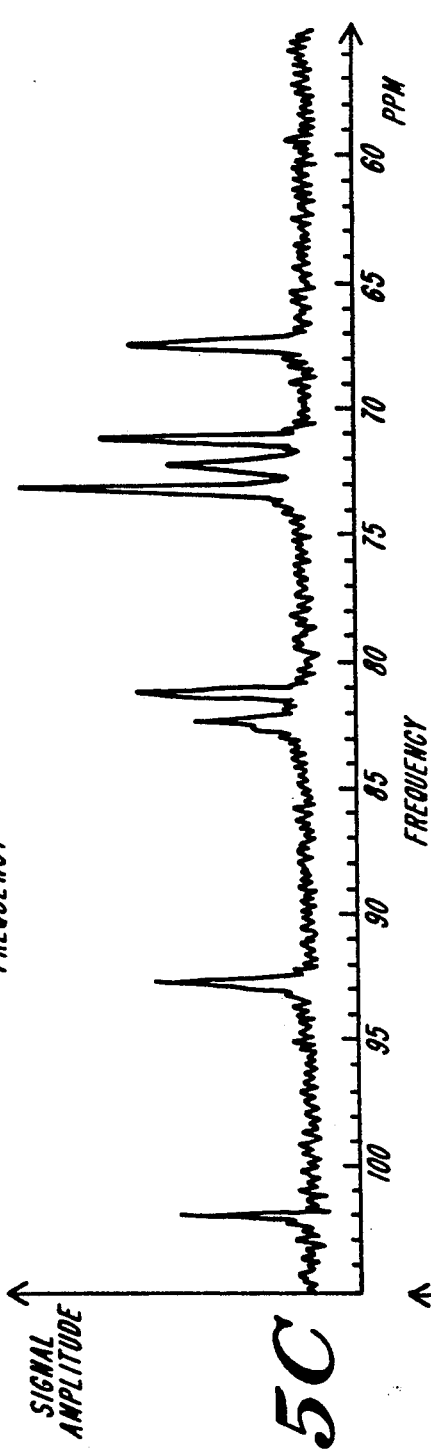
FIG. 5C is a composite signal spectrum diagram of signal amplitude versus frequency obtained by subtracting the signal amplitudes of the spectrum shown in FIG. 5B from the signal amplitudes of the spectrum shown in FIG. 5A with slight adjustments.
Figure 5D:
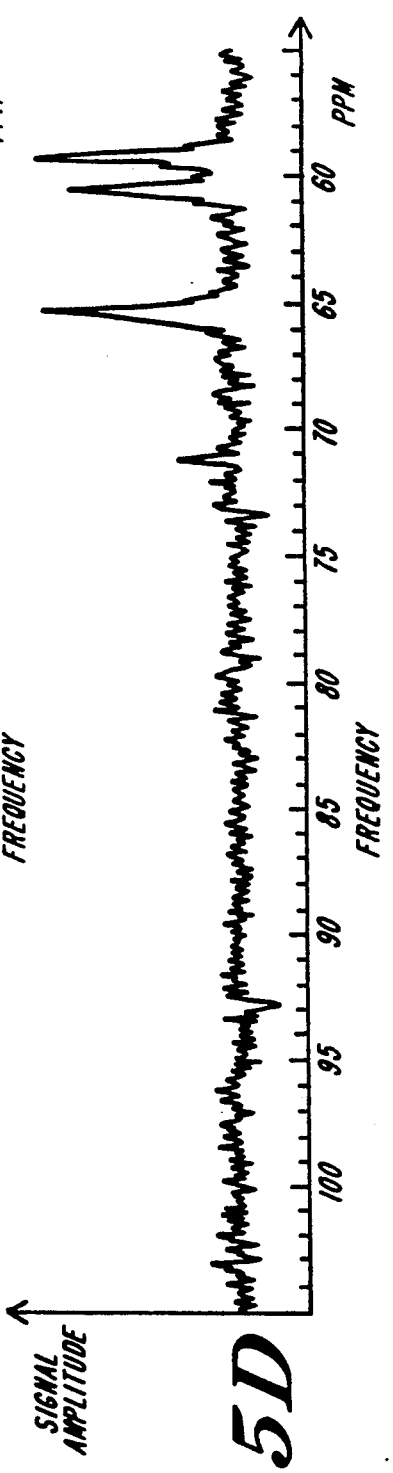
FIG. 5D is a composite signal spectrum diagram of signal amplitude versus frequency obtained by subtracting the signal amplitudes of the spectrum shown in FIG. 5A from doubled signal amplitudes of the spectrum shown in FIG. 5B with slight adjustments.

The selectivity is best seen from a difference spectrum shown in FIG. 5C, obtained by simply subtracting the spectrum shown in FIG. 5B from that shown in FIG. 5A without any adjustment of the relative spectral amplitudes. As shown in FIG. 5C, in the difference spectrum, only the non-methylene lines appear. On the other hand, doubling the amplitude of the FIG. 5B spectrum before subtracting the FIG. 5A spectrum results in a difference spectrum, shown in FIG. 5D, in which only the methylene resonances appear.

In contrast to the first embodiment, the spectral editing properties of this latter embodiment are not degraded by line broadening caused by sample inhomogeneity or other resonance line broadening factors, nor do they depend on the relative strengths of the heteronuclear dipolar couplings. Therefore, latter embodiment can successfully edit spectra in many cases where first embodiment is ineffective, such as polystyrene. For example FIGS. 6A-6D present spectral results for polystyrene using the second inventive embodiment.

Figure 6C:
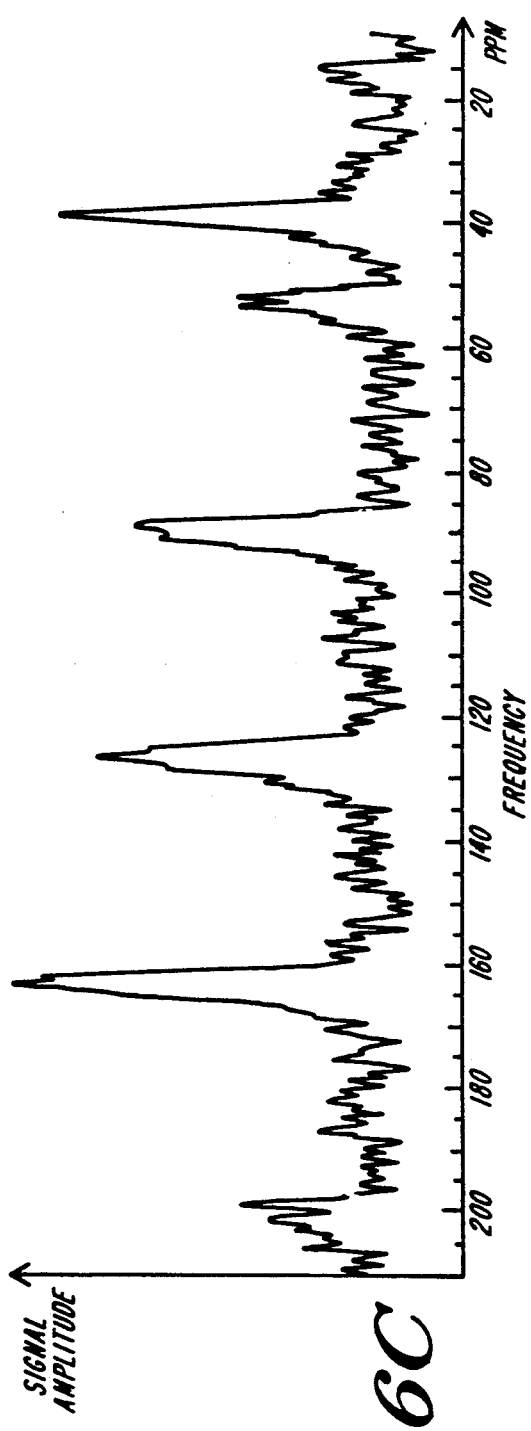
FIG. 6C is a composite signal spectrum diagram of signal amplitude versus frequency obtained by subtracting the signal amplitudes of the spectrum shown in FIG. 6B from the signal amplitudes of the spectrum shown in FIG. 6A with slight adjustments.
Figure 6D:
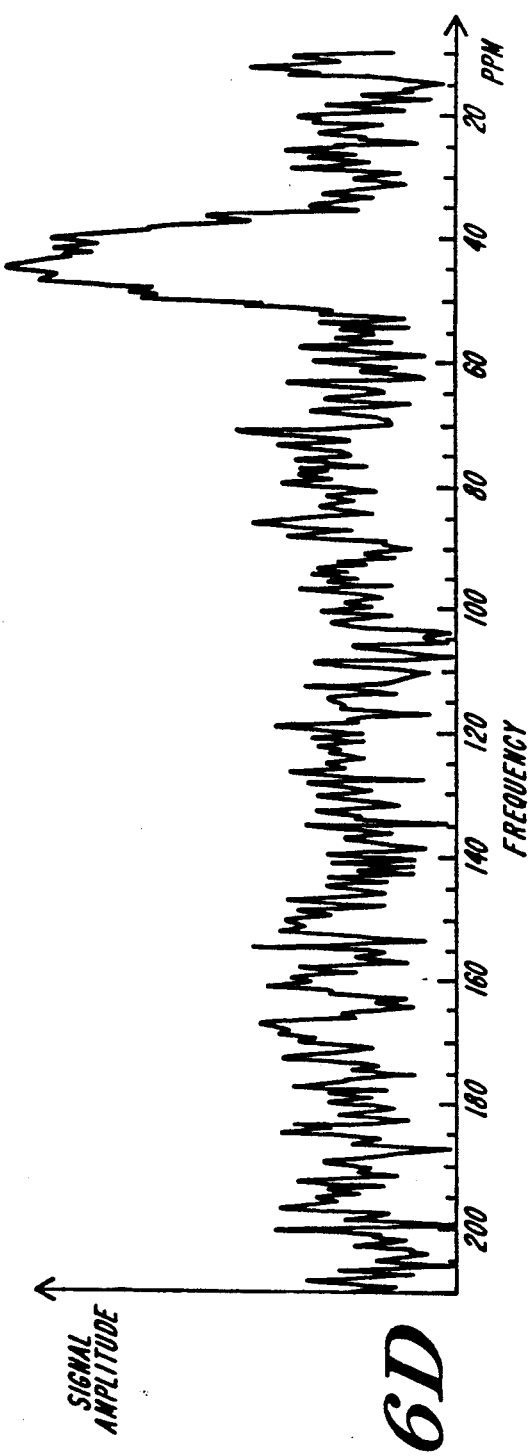
FIG. 6D is a composite signal spectrum diagram of signal amplitude versus frequency obtained by subtracting the signal amplitudes of the spectrum shown in FIG. 6A from doubled signal amplitudes of the spectrum shown in FIG. 6B with slight adjustments.

As with the spectra shown in FIGS. 2A-2C, 3A-3D and 5A-5D, the experiments which resulted in the FIGS. 6A-6D spectra were run on the same spectrometer and tuning procedure. FIG. 6A shows an output spectra taken after four WIM cycles and thus it is not an a rotor period multiple. FIG. 6B shows a spectra taken after three WIM cycles or at a rotor period multiple. FIG. 6C shows a difference spectrum obtained by subtracting the spectrum shown in FIG. 6B from that shown in FIG. 6A with some adjustment of the relative spectral amplitudes and FIG. 6D shows a difference spectrum obtained by doubling the amplitude of the FIG. 6B spectrum before subtracting the FIG. 6A spectrum and adjusting the relative signal amplitudes.

It can be clearly seen in FIGS. 6C and 6D that the only methylene resonance is the broad line at a frequency of 45 ppm. In this instance, the second inventive embodiment serves not only to identify the methylene resonance, but also to deconvolute it from an overlapping methyl resonance at a frequency of 42 ppm.

Although only two embodiments of the inventive method have been described, several modifications and changes will be immediately apparent to those skilled in the art. For example, the inventive method may be used in combination with conventional dipolar dephasing editing techniques. Although the above discussion has been in terms of cross-polarization between protons and $^{13}C$ nuclei, the inventive methods are also applicable to heteronuclear cross polarization experiments involving other nuclei as well. In addition, the inventive methods can also be combined in a straightforward way with spinning sideband suppression techniques such as SELTICS and TOSS.

These modifications and other obvious changes are intended to be covered by the following claims.

What is claimed is:

1. In a solid-state, cross-polarization magic angle spinning NMR experiment involving a first nuclear species and a second nuclear species wherein said sample is rotated at a fixed rotation frequency and said first nuclear species is excited with at least one radio-frequency preparation pulse; said first nuclear species and said second nuclear species are subsequently irradiated with cross polarization radiation and said first nuclear species is irradiated with decoupling radiation while transverse magnetization is being detected from said second nuclear species, a method for spectral editing comprising the steps of:
   A. irradiating said first nuclear species and second nuclear species with cross polarization radiation comprising at least one radio frequency pulse sequence having a predetermined time duration and composed of twenty four 90° radio frequency pulses having the relative phases:
      −Y, X, −Y, −Y, X, −Y, Y, X, Y, Y, X, Y, −Y, −X, −Y, −Y, −X, −Y, Y, −X, Y, Y, −X, Y
      where the phase of an X pulse differs from the phase of a Y pulse by 90°, the phase of an X pulse differs from the phase of a −X pulse by 180° and the phase of a Y pulse differs from the phase of a −Y pulse by 180°; and
   B. adjusting said sample rotation frequency so that a rotation period is an integral multiple of said radio frequency pulse sequence time duration.

2. In a solid state, cross-polarization magic angle spinning NMR experiment, the spectral editing method according to claim 1 wherein said first nuclear species techniques a proton and said second nuclear species is a carbon nucleus.

3. A method for obtaining an edited NMR output spectrum of a solid sample comprising the steps of:
   A. placing said sample in a uniform static magnetic field having a field direction;
   B. physically rotating said sample at a predetermined frequency around an axis canted at an angle of 54°44′ to said magnetic field direction;
   C. exciting a first gyromagnetic nuclear species having a Larmor frequency in said sample with at least one radio frequency preparation pulse having a frequency at said first species Larmor frequency and a field direction oriented 90° to said magnetic field direction;
   D. irradiating said first nuclear species with cross polarization radiation at said first species Larmor frequency, said cross polarization radiation comprising at least one radio frequency pulse sequence having a first predetermined time duration and composed of twenty-four 90° radio frequency pulses having the relative phases:
      −Y, X, −Y, −Y, X, −Y, Y, X, Y, Y, X, Y, −Y, −X, −Y, −Y, −X, −Y, Y, −X, Y, Y, −X, Y
      where the phase of an X pulse differs from the phase of a Y pulse by 90°, the phase of an X pulse differs from the phase of a −X pulse by 180° and the phase of a Y pulse differs from the phase of a −Y pulse by 180°;
   E. irradiating a second nuclear species with cross-polarization radiation at a second species Larmor frequency, said cross polarization radiation comprising at least one radio-frequency pulse sequence having a second predetermined time duration and composed of twenty four 90° radio frequency pulses having the relative phases:
      −Y, X, −Y, −Y, X, −Y, Y, X, Y, Y, X, Y, −Y, −X, −Y, −Y, −X, −Y, Y, −X, Y, Y, −X, Y
      where the phase of an X pulse differs from the phase of a Y pulse by 90°, the phase of an X pulse differs from the phase of a −X pulse by 180° and the phase of a Y pulse differs from the phase of a −Y pulse by 180°;
   F. adjusting said sample rotation frequency so that a rotation period is an integral multiple of said first time duration;
   G. irradiating a second nuclear species having a Larmor frequency with continuous wave cross polarization radiation having frequency at said second species Larmor frequency;
   H. irradiating said first nuclear species with decoupling radiation at said first species Larmor frequency; and
   I. detecting transverse magnetization from said second nuclear species during step H.

4. A method for obtaining an edited NMR output spectrum of a solid sample according to claim 3 wherein step E comprises the step of:
   E1. irradiating a second nuclear species with a cross-polarization radiation pulse sequence having a second predetermined time duration equal to said first predetermined time duration.

5. A method for obtaining an edited NMR output spectrum of a solid sample according to claim 3 wherein step H comprises the steps of:
   H1. irradiating said first nuclear species with decoupling radiation at said first species Larmor frequency;
   H2. temporarily interrupting said irradiation; and
   H3. continuing irradiating said first nuclear species with decoupling radiation at said first species Larmor frequency.

6. A method for obtaining an edited NMR output spectrum of a solid sample according to claim 5 wherein step I comprises the step of:
   I1. detecting transverse magnetization from said second nuclear species during step H3.

7. A method for obtaining an edited NMR output spectrum of a solid sample according to claim 3 wherein said first nuclear species is a proton and said second nuclear species is a carbon nucleus.

* * * * *